(12) United States Patent
Pan et al.

(10) Patent No.: US 9,774,068 B2
(45) Date of Patent: Sep. 26, 2017

(54) FILTER CONFIGURATION

(71) Applicant: I-SHOU UNIVERSITY, Kaohsiung (TW)

(72) Inventors: Chung-Long Pan, Kaohsiung (TW); Rong-Ching Wu, Kaohsiung (TW); Tsu-Chung Tan, Kaohsiung (TW)

(73) Assignee: I-Shou University, Kaohsiung (TW)

(*) Notice: Subject to any disclaimer, the term of this patent is extended or adjusted under 35 U.S.C. 154(b) by 91 days.

(21) Appl. No.: 14/983,648

(22) Filed: Dec. 30, 2015

(65) Prior Publication Data

US 2017/0194684 A1  Jul. 6, 2017

(51) Int. Cl.
*H01P 1/203*  (2006.01)
*H03H 7/38*  (2006.01)

(52) U.S. Cl.
CPC .............. *H01P 1/203* (2013.01); *H03H 7/38* (2013.01)

(58) Field of Classification Search
CPC ................................. H01P 1/203; H03H 7/38
USPC ............................ 333/33, 34, 238, 246, 204
See application file for complete search history.

(56) References Cited

U.S. PATENT DOCUMENTS

| | | | |
|---|---|---|---|
| 7,106,145 B2* | 9/2006 | Hsu ........................ | H01P 3/08 333/246 |
| 2005/0083148 A1* | 4/2005 | Hsu ........................ | H01P 3/08 333/33 |
| 2005/0237126 A1* | 10/2005 | Babb ...................... | H01P 3/08 333/34 |
| 2005/0258919 A1* | 11/2005 | Lee ....................... | H01P 1/20381 333/204 |

* cited by examiner

*Primary Examiner* — Stephen E Jones
(74) *Attorney, Agent, or Firm* — Alan D. Kamrath; Kamrath IP Lawfirm, P.A.

(57) ABSTRACT

A filter configuration including a substrate, a primary microstrip line and a first defected ground structure is disclosed. The substrate has a first face and a second face. The second face is a ground face. The primary microstrip line is arranged on the first face and extends in a first direction. The first defected ground structure is arranged on the second face. The first defected ground structure includes a first section, a first circular section, a second section, a second circular section and a third section that are connected to each other in sequence in a second direction perpendicular to the first direction. The second section is covered by the primary microstrip line in a vertical direction perpendicular to the first and second faces. The primary microstrip line has a width equal to a minimum length of the second section. As such, the filtering effect can be improved.

13 Claims, 8 Drawing Sheets

FILTER CONFIGURATION

BACKGROUND OF THE INVENTION

1. Field of the Invention

The present disclosure generally relates to a filter configuration with at least one defected ground structure and, more particularly, to a filter configuration whose performance is improved through the use of at least one defected ground structure.

2. Description of the Related Art

Wireless communication technology has changed the way people exchange messages. In order to meet different demands of the users exchanging messages, the wireless transceivers with multiple modes and multiple bandwidths have become the essential components in the communication system. For example, since the wireless communication standards IEEE 802.11a and IEEE 802.11g operate at the bandwidths of 2.4 GHz and 5.2 GHz respectively, the wireless transceiver must include a band-pass filter in order to operate at both 2.4 GHz and 5.2 GHz. The band-pass filter is able to form a band-pass effect at each of the frequencies of 2.4 GHz and 5.2 GHz while excluding the signals at any frequency other than the above two frequencies, thereby achieving the multi-bandwidth transmission.

A band-pass filter may be formed by one or more step impedance resonators (SIR). For example, the band-pass filter may include two resonators. Each of the resonators usually has an electrical length of a half or a quarter of the wavelength, and includes a plurality of microstrip lines. As such, the filter can form a band-pass effect at a predetermined frequency by adjusting the coupling effects among the plurality of microstrip lines.

In general, the accuracy of the band-pass frequency and the decrement in the insertion loss have been the important indicators in evaluating the performance of the filter. However, the lengths or widths of the plurality of microstrip lines are often adjusted to change the band-pass frequency and to reduce the insertion loss of the conventional band-pass filter without taking the effect of the defected ground structure(s) into consideration. As a result, the accuracy of the band-pass frequency cannot be further improved, and the insertion loss cannot be further reduced.

In order to improve the performance of the conventional band-pass filter, it is necessary to provide a novel filter with at least one defected ground structure.

SUMMARY OF THE INVENTION

It is therefore the objective of this disclosure to provide a novel filter configuration with at least one defected ground structure. The filter configuration is able to have a precise band-pass frequency and to further reduce the insertion loss through the use of at least one defected ground structure, thus improving the performance thereof.

In an embodiment of the disclosure, a filter configuration including a substrate, a primary microstrip line and a first defected ground structure is disclosed. The substrate has a first face and a second face. The second face is a ground face. The primary microstrip line is arranged on the first face of the substrate and extends in a first direction. The first defected ground structure is arranged on the second face of the substrate. The first defected ground structure includes a first section, a first circular section, a second section, a second circular section and a third section that are connected to each other in sequence in a second direction perpendicular to the first direction. The second section is covered by the primary microstrip line in a vertical direction perpendicular to the first face and the second face. The primary microstrip line has a width equal to a minimum length of the second section in the second direction. As such, the filtering effect can be improved.

In a form shown, the first section, the second section and the third section have a first central line in common. The first central line extends in the second direction and passes a center of each of the first circular section and the second circular section. As such, the filtering effect can be improved.

In the form shown, each of the first section, the second section and the third section has a same width in the first direction. As such, the filtering effect can be improved.

In the form shown, the first section has a minimum length that is smaller than the minimum length of the second section and is equal to a minimum length of the third section. As such, the filtering effect can be improved.

In the form shown, the first circular section has a same radius as the second circular section. As such, the filtering effect can be improved.

In the form shown, the filter configuration further includes a second defected ground structure arranged on the second face of the substrate. The second defected ground structure includes a fourth section, a third circular section, a fifth section, a fourth circular section and a sixth section that are connected to each other in sequence in the second direction. The fifth section is covered by the primary microstrip line in the vertical direction perpendicular to the first face and the second face. The width of the primary microstrip line is equal to a minimum length of the fifth section in the second direction. As such, the filtering effect can be improved.

In the form shown, the fourth section, the fifth section and the sixth section have a second central line in common. The second central line extends in the second direction and passes a center of each of the third circular section and the fourth circular section. As such, the filtering effect can be improved.

In the form shown, the first section, the second section and the third section have a first central line in common. The first central line extends in the second direction. The primary microstrip line includes a coupling end coupled with a secondary microstrip line. The second central line is located between the first central line and the coupling end. The second central line is spaced from the first central line at a first distance in the first direction, and is spaced from the coupling end at a second distance. The first distance is larger than the second distance. As such, the filtering effect can be improved.

In the form shown, each of the fourth section, the fifth section and the sixth section has a same width in the first direction. As such, the filtering effect can be improved.

In the form shown, the fourth section has a minimum length that is smaller than a minimum length of the fifth section and is equal to a minimum length of the sixth section. As such, the filtering effect can be improved.

In the form shown, the first section has a minimum length that is smaller than the minimum length of the second section and is equal to a minimum length of the third section. The minimum length of the first section is larger than the minimum length of the fourth section, and the minimum length of the second section is equal to the minimum length of the fifth section. As such, the filtering effect can be improved.

In the form shown, the third circular section has a same radius as the fourth circular section. As such, the filtering effect can be improved.

In the form shown, the first circular section has a same radius as the second circular section, and the first circular section has a larger radius than the third circular section. As such, the filtering effect can be improved.

BRIEF DESCRIPTION OF THE DRAWINGS

The present disclosure will become more fully understood from the detailed description given hereinafter and the accompanying drawings which are given by way of illustration only, and thus are not limitative of the present disclosure, and wherein.

Figure 1:
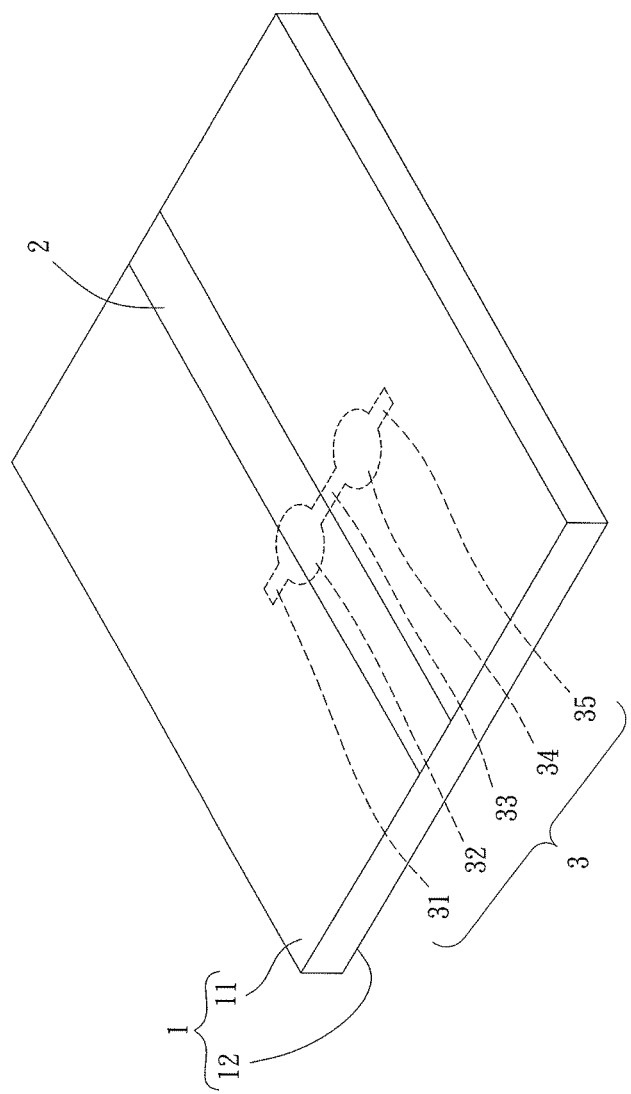
FIG. 1 is a perspective view of a filter configuration with one defected ground structure according to a first embodiment of the disclosure.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the disclosure.

DETAILED DESCRIPTION OF THE INVENTION

The term "coupled/coupling" refers to a connection mechanism in which the energy is transferred from one entity to another entity.

Figure 2:
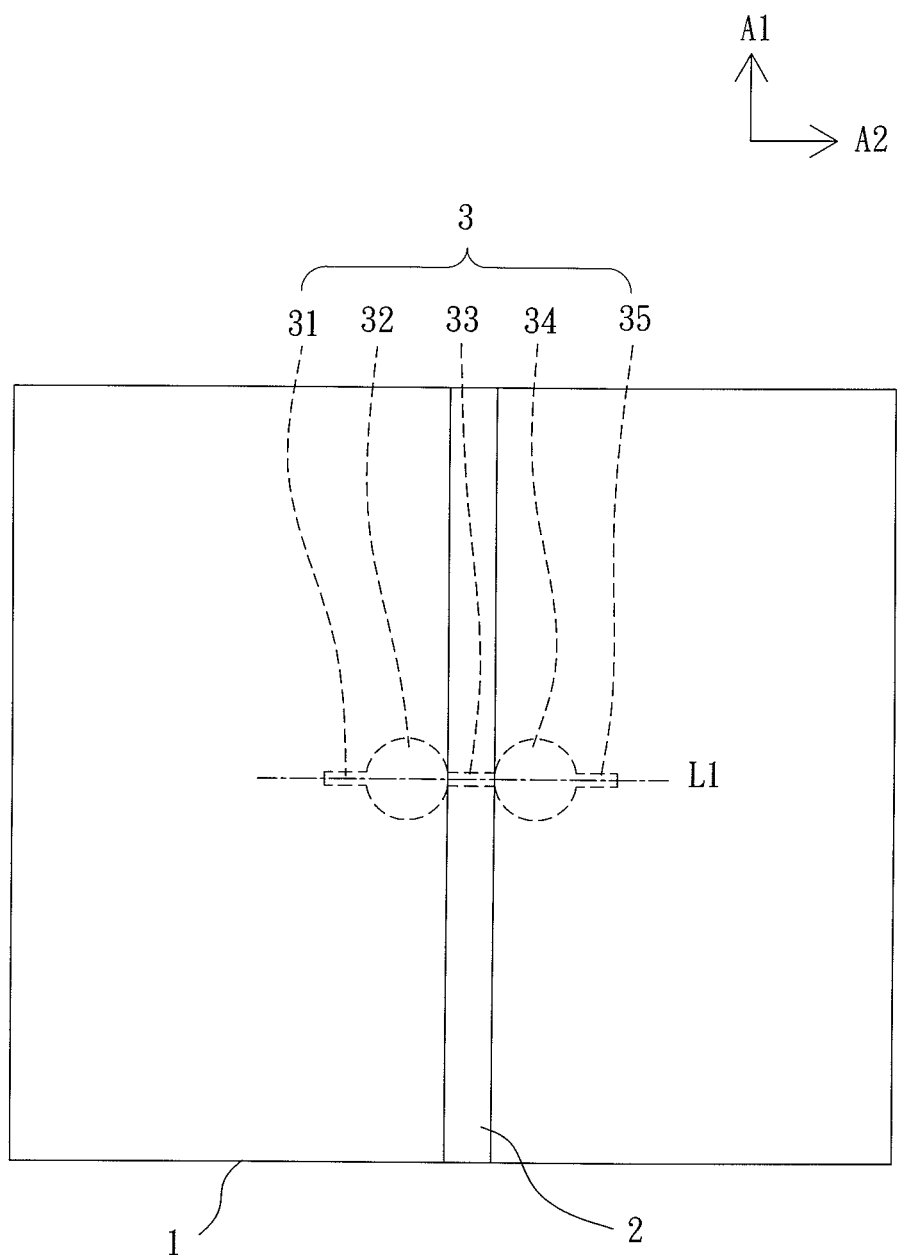
FIG. 2 is a plane view of the filter configuration with one defected ground structure according to the first embodiment of the disclosure.

FIGS. 1 and 2 show a filter configuration with one defected ground structure according to a first embodiment of the disclosure. The filter configuration includes a substrate 1, a primary microstrip line 2 and a first defected ground structure 3. The primary microstrip line 2 and the first defected ground structure 3 are arranged on different faces of the substrate 1, respectively.

The substrate 1 includes a first face 11 and a second face 12. The second face 12 is a ground face. The substrate 1 may be a printed circuit board. The main material of the printed circuit board may be glass fiber, but is not limited thereto. The primary microstrip line 2 is arranged on the first face 11 of the substrate 1 and extends in a first direction A1. The primary microstrip line 2 may be in the form of a coupled line that is commonly used in a resonator for signal coupling purposes, or in the form of a tapped line that is used as a signal input end or a signal output end. In the first embodiment, the primary microstrip line 2 is used as a tapped line.

The first defected ground structure 3 is arranged on the second face 12 of the substrate 1. The first defected ground structure 3 includes a first section 31, a first circular section 32, a second section 33, a second circular section 34 and a third section 35, which are connected to each other in sequence in a second direction A2 perpendicular to the first direction A1. The second section 33 is covered by the primary microstrip line 2 in a vertical direction perpendicular to the first face 11 and the second face 12. The width of the primary microstrip line 2 is equal to the minimum length of the second section 33 in the second direction A2, such that the primary microstrip line 2 does not cover the first circular section 32 and the second circular section 34. Thus, when the filter configuration is provided with the first defected ground structure 3 which is arranged with respect to the primary microstrip line 2 in the manner as stated above, the first defected ground structure 3 is able to improve the performance of the filter configuration.

Specifically, the first section 31, the second section 33 and the third section 35 have a first central line L1 in common, which extends in the second direction A2. The first central line L1 passes the centers of the first circular section 32 and the second circular section 34. Each of the first section 31, the second section 33 and the third section 35 has the same width in the first direction A1. In addition, each of the first section 31, the second section 33 and the third section 35 includes at least one end connected to the first circular section 32 or the second circular section 34. Thus, as the first central line L1 passes the centers of the first circular section 32 and the second circular section 34, each of the first section 31, the second section 33 and the third section 35 can have a minimum length on the first central line L1. The minimum length of the first section 31 is smaller than the minimum length of the second section 33, but is equal to the minimum length of the third section 35. The first circular section 32 has the same radius as the second circular section 34. Thus, when the filter configuration is provided with the first defected ground structure 3 according to the above dimensional relationship, the first defected ground structure 3 is able to improve the performance of the filter configuration.

Figure 3:
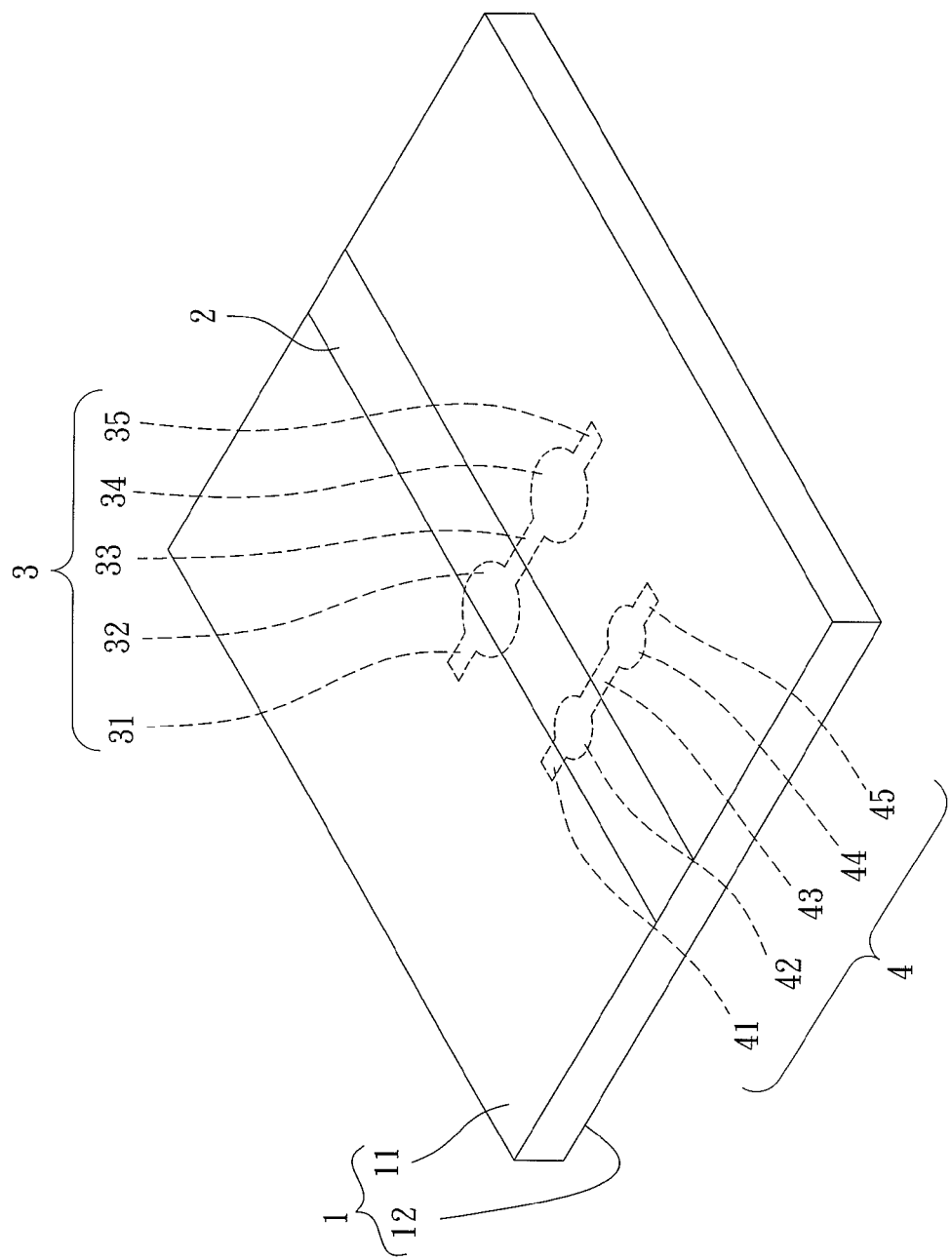
FIG. 3 is a perspective view of a filter configuration with two defected ground structures according to a second embodiment of the disclosure.
Figure 4:
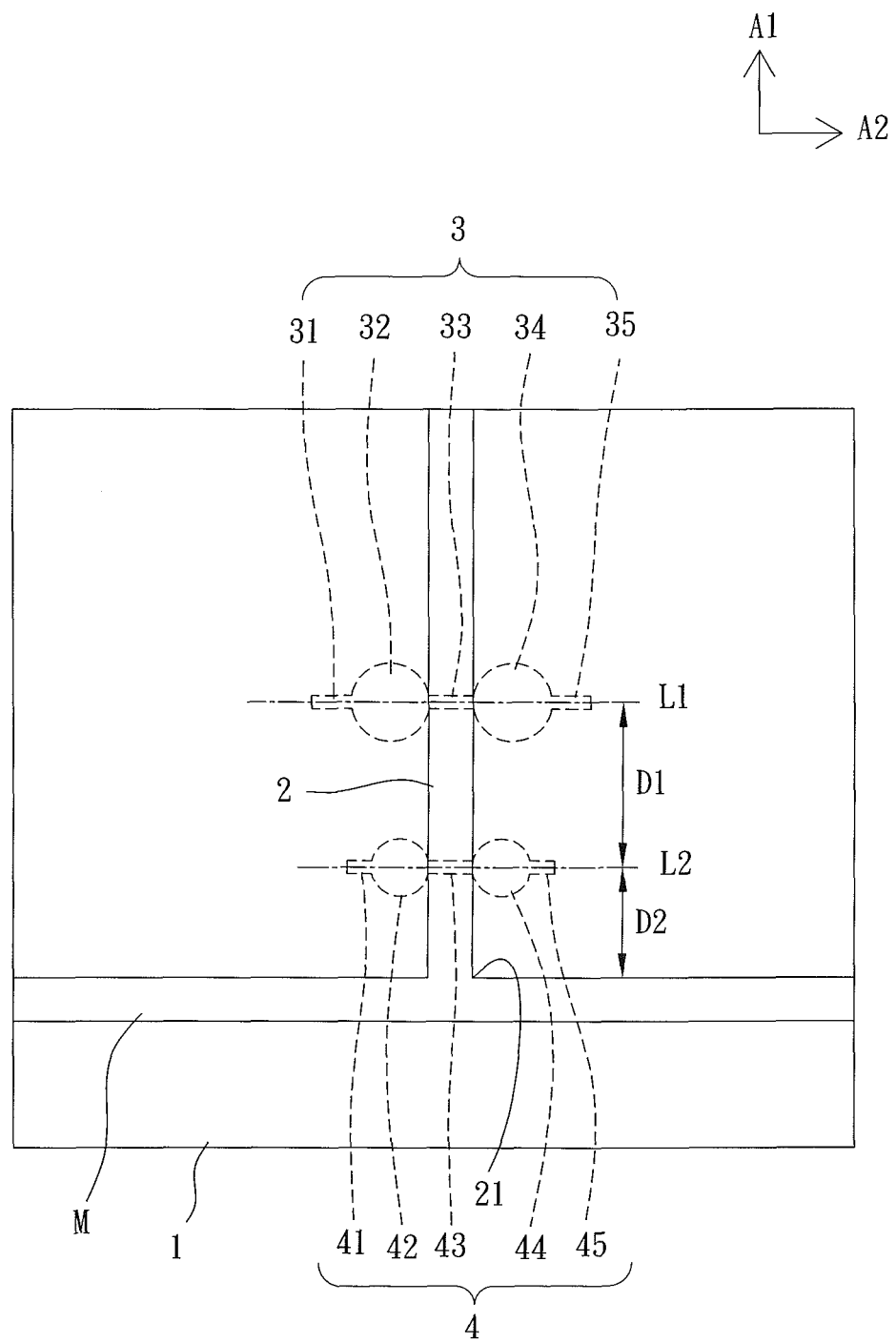
FIG. 4 is a plane view of the filter configuration with two defected ground structures according to the second embodiment of the disclosure.

Referring to FIGS. 3 and 4, based on the arrangement of the substrate 1, the primary microstrip line 2 and the first defected ground structure 3, the filter configuration may further include a second defected ground structure 4 arranged on the second face 12 of the substrate 1 according to a second embodiment of the disclosure. The second defected ground structure 4 includes a fourth section 41, a third circular section 42, a fifth section 43, a fourth circular section 44 and a sixth section 45, which are connected to each other in sequence in the second direction A2. The fifth section 43 is covered by the primary microstrip line 2 in the vertical direction perpendicular to the first face 11 and the second face 12. The width of the primary microstrip line 2 is equal to a minimum length of the fifth section 43 in the second direction A2, such that the primary microstrip line 2 does not cover the third circular section 42 and the fourth circular section 44. Thus, when the filter configuration is provided with the second defected ground structure 4 which is arranged with respect to the primary microstrip line 2 in the manner as stated above, the second defected ground structure 4 is able to improve the performance of the filter configuration.

Specifically, the fourth section 41, the fifth section 43 and the sixth section 45 have a second central line L2 in common, which extends in the second direction A2. The second central line L2 passes the centers of the third circular section 42 and the fourth circular section 44. Each of the fourth section 41, the fifth section 43 and the sixth section 45 has the same width in the first direction A1. In addition, each of the fourth section 41, the fifth section 43 and the sixth section 45 includes at least one end connected to the third circular section 42 or the fourth circular section 44. Thus, as the second central line L2 passes the centers of the third circular section 42 and the fourth circular section 44, each of the fourth section 41, the fifth section 43 and the sixth section 45 can have a minimum length on the second central line L2. The minimum length of the fourth section 41 is smaller than the minimum length of the fifth section 43, but is equal to the minimum length of the sixth section 45. The third circular section 42 has the same radius as the fourth circular section 44. Thus, when the filter configuration is provided with the second defected ground structure 4 according to the above dimensional relationship, the second defected ground structure 4 is able to improve the performance of the filter configuration.

Referring to FIG. 5 again, based on the arrangement of the first defected ground structure 3 and the second defected ground structure 4, it can be assumed that the primary microstrip line 2 includes a coupling end 21 adapted to be coupled with the secondary microstrip line "M." In this regard, the second central line L2 is located between the first central line L1 and the coupling end 21. Furthermore, in the first direction A1, the second central line L2 is spaced from the first central line L1 at a first distance D1, and is spaced from the coupling end 21 at a second distance D2. The first distance D1 is larger than the second distance D2. Moreover, each of the first section 31, the first circular section 32, the second section 33, the fourth section 41, the fifth section 43 and the sixth section 45 has the same width in the first direction A1. In the second direction A2, the minimum length of the first section 31 is larger than the minimum length of the fourth section 41, and the minimum length of the second section 33 is equal to the minimum length of the fifth section 43. In addition, the first circular section 32 has a larger radius than the third circular section 42. As such, when the filter configuration is provided with the second defected ground structure 4 which is arranged with respect to the primary microstrip line 2 in the manner as stated above, the second defected ground structure 4 is able to improve the performance of the filter configuration. For example, the first defected ground structure 3 may be used to suppress the harmonic wave with the frequency of 6.5 GHz and higher, and the second defected ground structure 4 is used to generate the band-pass effect at 2.4 GHz and 5.2 GHz. As such, the performance of the filter configuration can be improved.

Figure 5:
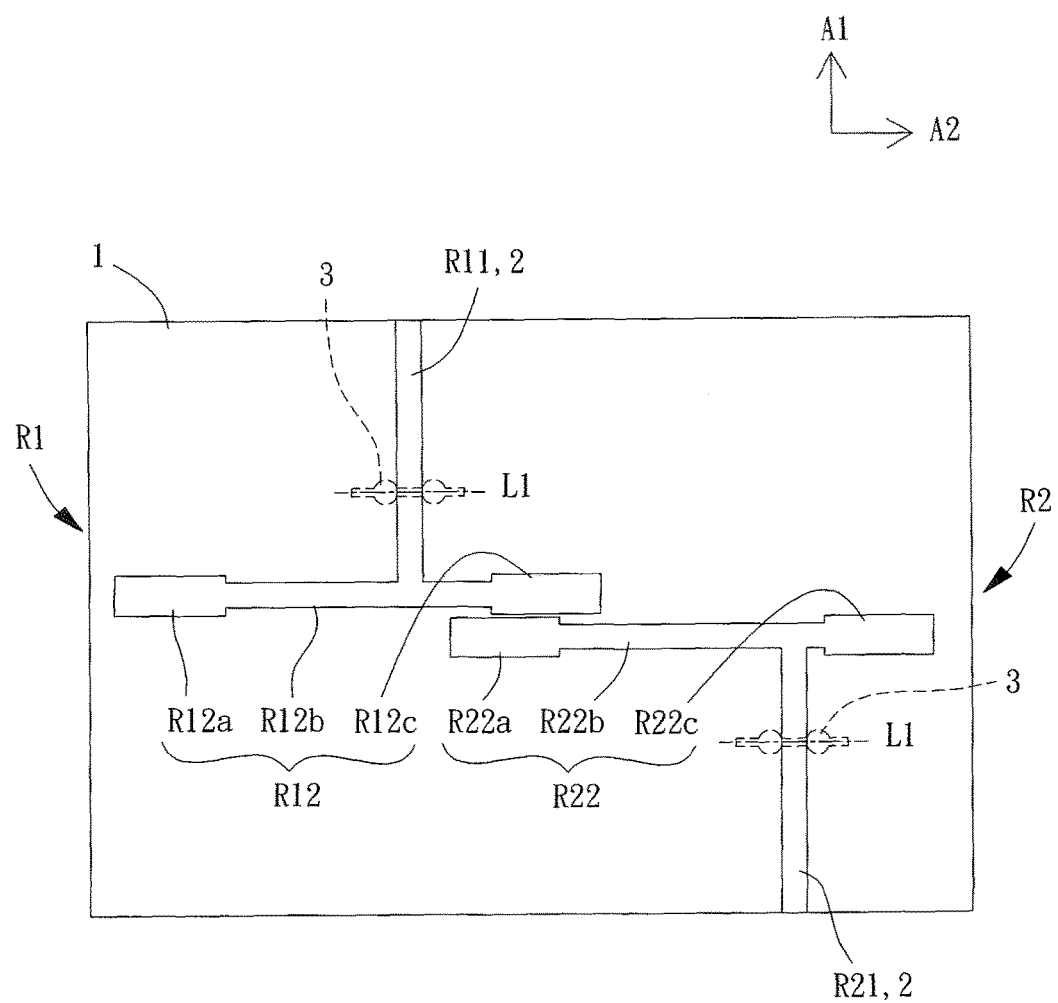
FIG. 5 shows a step impedance resonator filter formed by the filter configuration of the first embodiment of the disclosure.

FIG. 5 shows a step impedance resonator filter using the filter configuration of the first embodiment of the disclosure. The step impedance resonator filter includes a first resonator R1 and a second resonator R2, which are coupled with each other and mounted on the substrate 1. The first resonator R1 includes a first tapped line R11 and a first coupled line R12. The first tapped line R11 may be used as the primary microstrip line 2. The first coupled line R12 includes a first part R12a, a second part R12b and a third part R12c in the second direction A2. The second resonator R2 includes a second tapped line R21 and a second coupled line R22. The second tapped line R21 may be used as the primary microstrip line 2. The second coupled line R22 includes a fourth part R22a, a fifth part R22b and a sixth part R22c in the second direction A2. There are two first defected ground structures 3. The first defected ground structure 3 is arranged with respect to the first tapped line R11 and the second tapped line R21 in a similar manner as the previously mentioned first defected ground structure 3 and primary microstrip line 2.

In order to prove that the filter configurations according to the first and second embodiments of the disclosure are capable of improving the filtering effect thereof, a simulation can be performed by a processor through the use of a software. The software can be of any conventional software capable of analyzing the frequency response, as it can be readily appreciated by the persons having ordinary skill in the art. The dimensional information of the first resonator R1 and the second resonator R2 can be seen in Table 1 below.

TABLE 1

| | | Length/Width (In the First Direction) by Length/Width (In the Second Direction) |
|---|---|---|
| First Resonator | First Part | 2.6 mm × 7.45 mm |
| | Second Part | 2 mm × 18 mm |
| | Third Part | 2.6 mm × 7.45 mm |
| | First Tapped Line | 18 mm × 2 mm |
| Second Resonator | Fourth Part | 2.6 mm × 7.45 mm |
| | Fifth Part | 2 mm × 18 mm |
| | Sixth Part | 2.6 mm × 7.45 mm |
| | Second Tapped Line | 18 mm × 2 mm |

In the above, the coupling length and the coupling gap between the first resonator R1 and the second resonator R2, the location of the first coupled line R12 to which the first tapped line R11 is connected, as well as the location of the second coupled line R22 to which the second tapped line R21 is connected, are not limited as they can be set by the user according to different requirements. When the length and width of each of the first resonator R1 and the second resonator R2 have the values as shown in Table 1 above, each of the first circular section 32 and the second circular section 34 has a radius between 0.8-1.4 mm, with 0.8 mm being preferred. In this situation, the first section 31, the first circular section 32, the second section 33, the second circular section 34 and the third section 35 have a total length between 7.2-11.2 mm in the second direction A2, with 7.2 mm being preferred.

Figure 6:
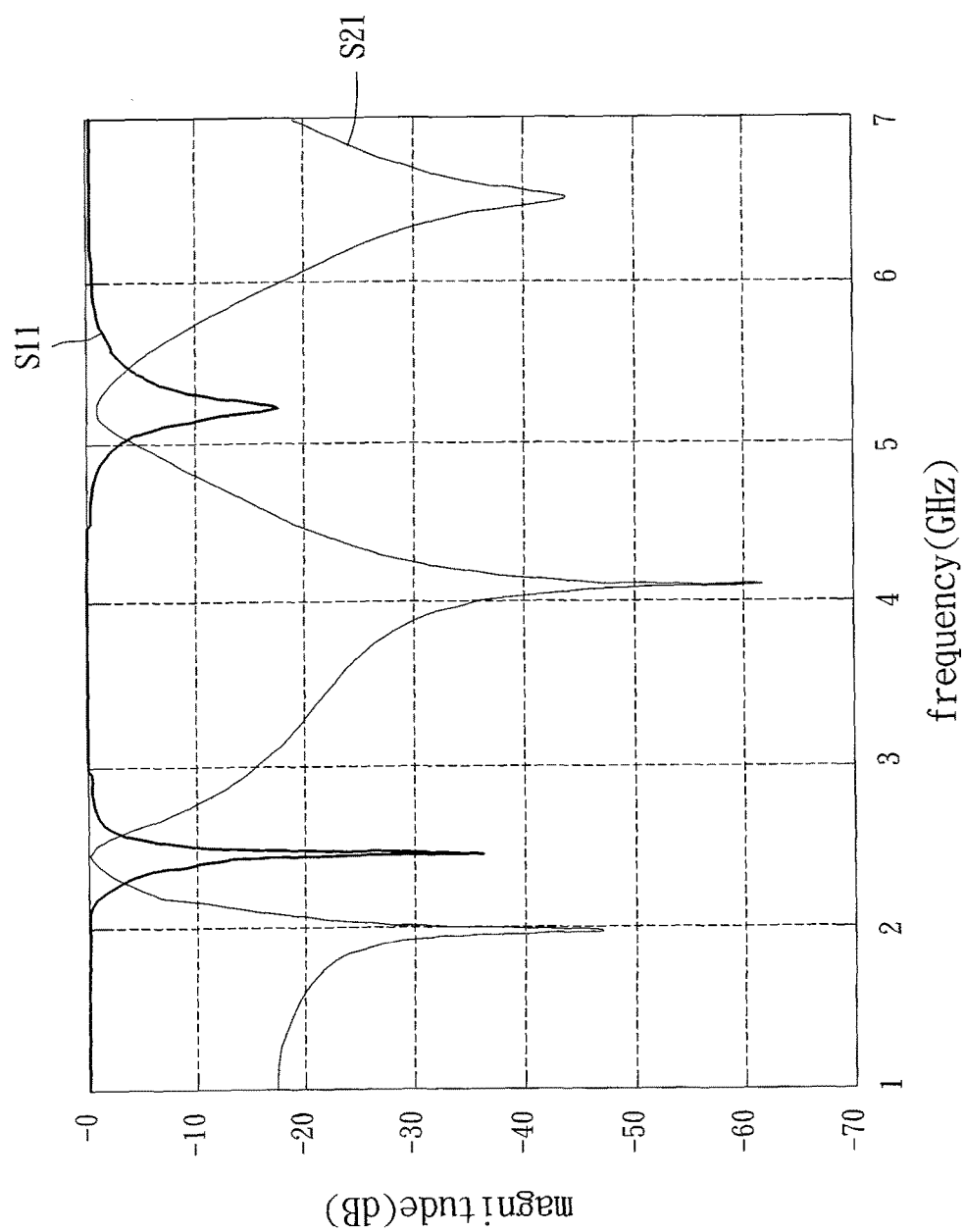
FIG. 6 shows a frequency response diagram of the step impedance resonator filter in FIG. 5, but without the arrangement of the first defected ground structures.
Figure 7:
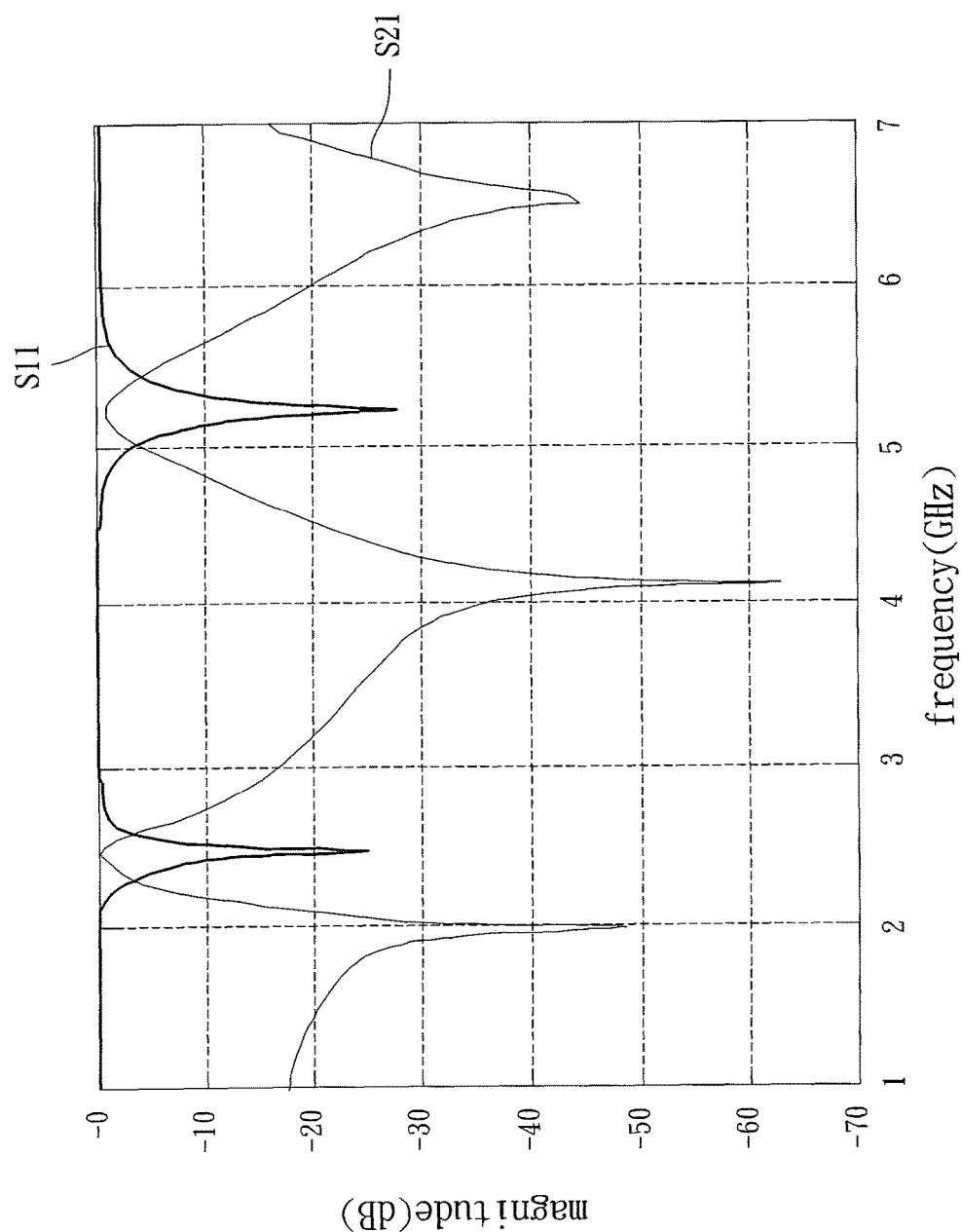
FIG. 7 shows a frequency response diagram of the step impedance resonator filter in FIG. 5.

Referring to FIGS. 5-7, FIG. 6 shows a frequency response diagram of the step impedance resonator filter without any defected ground structure, whereas FIG. 7 shows a frequency response diagram of the step impedance resonator filter with the first defected ground structures 3. In FIGS. 6-7, S11 is the return loss and S21 is the insertion loss. The radius of each of the first circular section 32 and the second circular section 34 is 0.8 mm. Furthermore, the width of each of the first section 31, the second section 33 and the third section 35 in the first direction A1 is 0.6 mm. The first section 31, the first circular section 32, the second section 33, the second circular section 34 and the third section 35 have a total length between 7.2 mm in the second direction A2. In the first resonator R1, the first central line L1 is spaced from the second part R12b at 6 mm. In the second resonator R2, the first central line L1 is spaced from the fifth part R22b at 6 mm. From the comparison between FIGS. 6 and 7, it can be observed that the band-pass frequencies can precisely fall at 2.4 GHz and 5.2 GHz through the arrangement of the first defected ground structures 3. In this situation, the insertion loss is 0.23 dB at 2.4 GHz and is 0.9 dB at 5.2 GHz while two transmission zeros are generated at 1.98 GHz and 4.27 GHz, respectively. Besides, the decrement of the insertion loss is more obvious. As such, it can be proven from the above frequency response diagram that the filter configuration of the disclosure does allow precise control of the band-pass frequencies and is able to reduce the insertion loss, thereby improving the performance of the filtering effect.

TABLE 2

| | The Radius of Each of the First and Second Circular Sections | Cut-off Frequency |
|---|---|---|
| 1 | 0.84 mm | 10.9 GHz |
| 2 | 1.0 mm | 9.9 GHz |
| 3 | 1.4 mm | 7.0 GHz |

Referring to Table 2 again, based on the step impedance resonator filter shown in FIG. 5 wherein the first circular section 32 and the second circular section 34 have the same radius as shown in Table 2, the step impedance resonator filter will be able to suppress the harmonic wave with a higher frequency. For example, when each of the first circular section 32 and the second circular section 34 has a radius of 1.4 mm, the step impedance resonator filter can suppress the harmonic wave of 7 GHz and higher. As such, the band-pass frequencies can precisely fall at 2.4 GHz and 5.2 GHz, attaining precise control of the band-pass frequencies.

Figure 8:
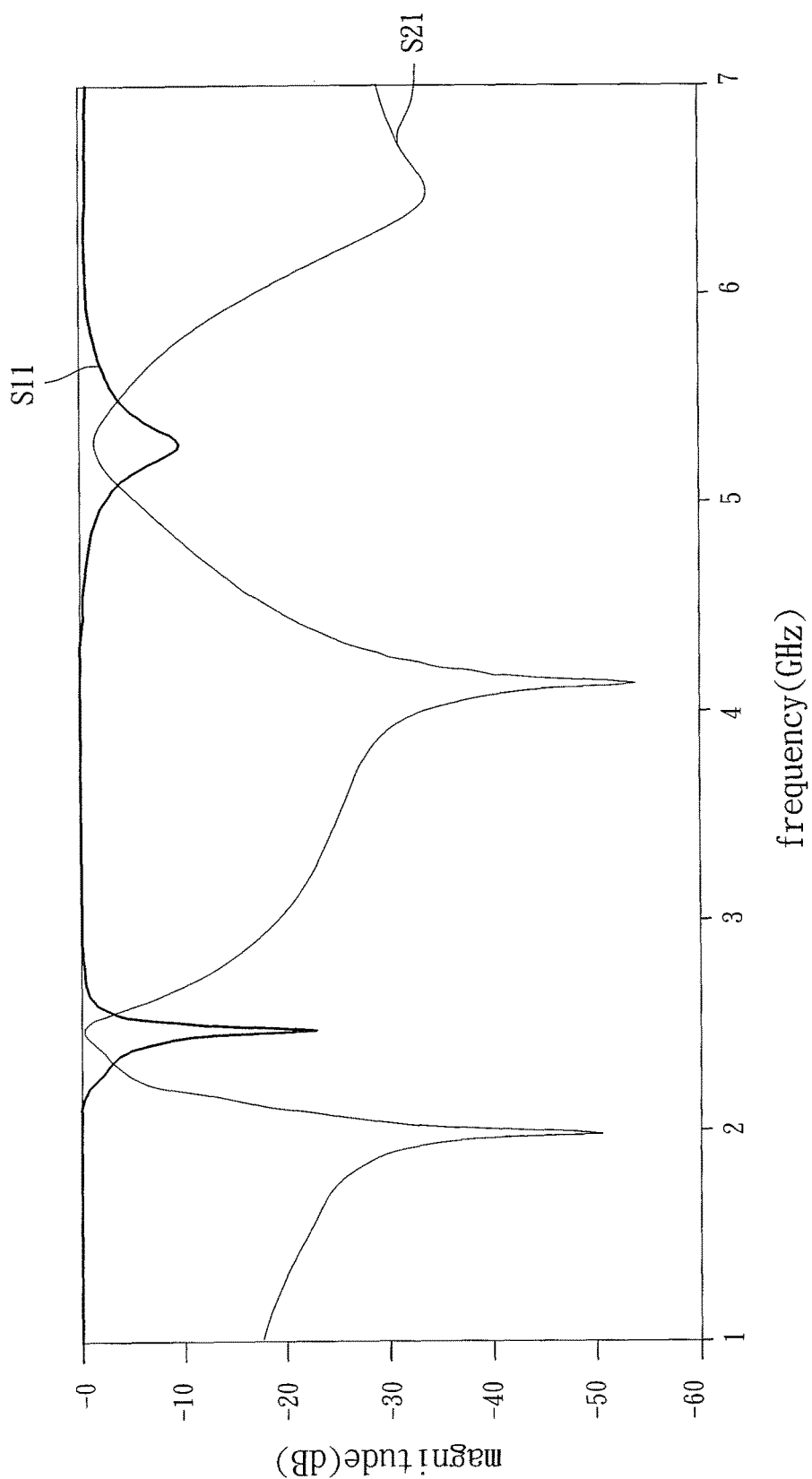
FIG. 8 shows a frequency response diagram of the step impedance resonator filter in FIG. 5, but with the addition of two second defected ground structures.

FIG. 8 shows a frequency response diagram of the step impedance resonator filter in FIG. 5 but with the addition of two second defected ground structures 4. In this structure, the radius of each of the first circular section 32 and the second circular section 34 is 1.4 mm and the radius of each of the third circular section 42 and the fourth circular section 44 is 0.8 mm. The first section 31, the first circular section 32, the second section 33, the second circular section 34 and the third section 35 have a total length of 11.2 mm in the second direction A2, and the fourth section 41, the third circular section 42, the fifth section 43, the fourth circular section 44 and the sixth section 45 have a total length of 7.2 mm in the second direction A2. In addition, the first distance D1 is 6 mm, and the second distance D2 is 4 mm. It can be observed from FIG. 8 that when the first defected ground structures 3 and the second defected ground structures 4 are arranged, not only the insertion loss at 2.4 GHz and 5.2 GHz can be reduced, but also the harmonic wave with the frequency of 6.5 GHz or higher can be suppressed. These advantages cannot be achieved by the conventional filter. The filter configuration according to the disclosure does provide an improved filtering effect.

In summary, the filter configurations according to the first and second embodiments of the disclosure do allow precise control of the band-pass frequencies and are able to reduce the insertion loss through the use of the defected ground structure(s), thus improving the filtering effect thereof.

Although the disclosure has been described in detail with reference to its presently preferable embodiments, it will be understood by one of ordinary skill in the art that various modifications can be made without departing from the spirit and the scope of the disclosure, as set forth in the appended claims.

What is claimed is:

1. A filter configuration comprising:
   a substrate having a first face and a second face, wherein the second face is a ground face;
   a primary microstrip line arranged on the first face of the substrate and extending in a first direction; and
   a first defected ground structure arranged on the second face of the substrate, wherein the first defected ground structure comprises a first section, a first circular section, a second section, a second circular section and a third section that are connected to each other in sequence in a second direction perpendicular to the first direction,
   wherein the second section is covered by the primary microstrip line in a vertical direction perpendicular to the first face and the second face, and
   wherein the primary microstrip line has a width equal to a minimum length of the second section in the second direction.

2. The filter configuration as claimed in claim 1, wherein each of the first section, the second section and the third section has a same width in the first direction.

3. The filter configuration as claimed in claim 1, wherein the first section has a minimum length that is smaller than the minimum length of the second section and is equal to a minimum length of the third section.

4. The filter configuration as claimed in claim 1, wherein the first circular section has a same radius as the second circular section.

5. The filter configuration as claimed in claim 1, wherein the first section, the second section and the third section have a first central line in common, wherein the first central line extends in the second direction and passes a center of each of the first circular section and the second circular section.

6. The filter configuration as claimed in claim 5, further comprising a second defected ground structure arranged on the second face of the substrate, wherein the second defected ground structure comprises a fourth section, a third circular section, a fifth section, a fourth circular section and a sixth section that are connected to each other in sequence in the second direction, wherein the fifth section is covered by the primary microstrip line in the vertical direction perpendicular to the first face and the second face, and wherein the width of the primary microstrip line is equal to a minimum length of the fifth section in the second direction.

7. The filter configuration as claimed in claim 6, wherein each of the fourth section, the fifth section and the sixth section has a same width in the first direction.

8. The filter configuration as claimed in claim 6, wherein the fourth section, the fifth section and the sixth section have a second central line in common, wherein the second central line extends in the second direction and passes a center of each of the third circular section and the fourth circular section.

9. The filter configuration as claimed in claim 8, wherein the first section, the second section and the third section have a first central line in common, wherein the first central line extends in the second direction, wherein the primary microstrip line comprises a coupling end coupled with a secondary microstrip line, wherein the second central line is located between the first central line and the coupling end, wherein the second central line is spaced from the first central line at a first distance in the first direction, and is spaced from the coupling end at a second distance, and wherein the first distance is larger than the second distance.

10. The filter configuration as claimed in claim 6, wherein the fourth section has a minimum length that is smaller than a minimum length of the fifth section and is equal to a minimum length of the sixth section.

11. The filter configuration as claimed in claim 10, wherein the first section has a minimum length that is smaller than the minimum length of the second section and is equal to a minimum length of the third section, and wherein the minimum length of the first section is larger than the minimum length of the fourth section, and the minimum length of the second section is equal to the minimum length of the fifth section.

12. The filter configuration as claimed in claim 6, wherein the third circular section has a same radius as the fourth circular section.

13. The filter configuration as claimed in claim 12, wherein the first circular section has a same radius as the second circular section, and wherein the first circular section has a larger radius than the third circular section.

\* \* \* \* \*